(12) United States Patent
Lai et al.

(10) Patent No.: US 7,432,559 B2
(45) Date of Patent: Oct. 7, 2008

(54) SILICIDE FORMATION ON SIGE

(75) Inventors: Jerry Lai, Keelung (TW); Chii-Ming Wu, Taipei (TW); Chih-Wei Chang, Hsin-Chu (TW); Shau-Lin Shue, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 133 days.

(21) Appl. No.: 11/523,683

(22) Filed: Sep. 19, 2006

(65) Prior Publication Data

US 2008/0121929 A1    May 29, 2008

(51) Int. Cl.
*H01L 29/40* (2006.01)

(52) U.S. Cl. ............... 257/377; 257/388; 257/486; 257/616; 257/742; 257/754; 257/757; 257/E29.193; 257/E21.182; 438/933

(58) Field of Classification Search ............ 257/377, 257/388.486, 616, 742, 754, 757, E29.193, 257/E21.182; 438/933
See application file for complete search history.

(56) References Cited

U.S. PATENT DOCUMENTS

| 6,881,635 | B1 * | 4/2005 | Chidambarrao et al. ..... 438/300 |
| 2005/0242340 | A1 * | 11/2005 | Chidambarrao et al. ....... 257/19 |
| 2006/0054968 | A1 * | 3/2006 | Lee .............................. 257/327 |
| 2006/0091490 | A1 * | 5/2006 | Chen et al. ................... 257/458 |
| 2006/0151787 | A1 * | 7/2006 | Chen et al. .................... 257/65 |
| 2006/0205194 | A1 * | 9/2006 | Bauer ........................... 438/542 |

* cited by examiner

*Primary Examiner*—Thanh V Pham
(74) *Attorney, Agent, or Firm*—Slater & Matsil, L.L.P.

(57) ABSTRACT

A semiconductor structure includes a first silicon-containing layer comprising an element selected from the group consisting essentially of carbon and germanium wherein the silicon-containing layer has a first atomic percentage of the element to the element and silicon, a second silicon-containing layer comprising the element over the first silicon-containing layer, and a silicide layer on the second silicon-containing layer. The element in the second silicon-containing layer has a second atomic percentage of the element to the element and silicon, wherein the second atomic percentage is substantially lower than the first atomic percentage.

20 Claims, 5 Drawing Sheets

SILICIDE FORMATION ON SIGE

TECHNICAL FIELD

This invention relates generally to integrated circuits, and more particularly to silicidation processes.

BACKGROUND

The deep-submicron scaling required for VLSI systems dominates design considerations in the microelectronics industry. As the gate electrode length is scaled down, the source and drain junctions must be scaled down accordingly to suppress the so-called short channel effects (SCE) that degrade performance of miniaturized devices. A major problem related to complementary metal oxide silicon (CMOS) scaling is the undesirable increase in parasitic resistance. As the source/drain junction depth and polycrystalline silicon line width are scaled into the deep-submicron range, contact resistance becomes more significant and needs to be reduced.

The principle way of reducing contact resistances between polysilicon gates and source/drain regions and interconnect lines is by forming metal silicides atop the source/drain regions and the gate electrodes prior to application of the conductive film for formation of the various conductive interconnect lines. Silicide regions are typically formed by a salicide (self-aligned silicide) process. In the salicide process, a thin layer of metal is blanket deposited over the semiconductor substrate, specifically over exposed source/drain and gate electrode regions. The wafer is then subjected to one or more annealing steps. This annealing process causes the metal to selectively react with the exposed silicon of the source/drain regions and the gate electrodes, thereby forming a metal silicide. The process is referred to as a self-aligned silicidation process because the silicide layer is formed only where the metal material directly contacts the silicon source/drain regions and the polycrystalline silicon (polysilicon) gate electrode. Following the formation of the silicide layer, the unreacted metal is removed and an interconnect process is performed to provide conductive paths, such as by forming via holes through a deposited interlayer dielectric and filling the via holes with a conductive material, e.g., tungsten.

The conventional silicide formation processes suffer drawbacks in certain cases. For example, in the formation of PMOS devices, the source/drain regions are often formed of SiGe. It has been found that the roughness of the silicide regions formed on SiGe is high, particularly at the interface between the SiGe and the overlying silicide regions. For integrated circuits with shallow junctions, the increase in roughness causes degradation in the performance of the MOS devices.

Accordingly, new methods for improving the process for forming silicide regions on SiGe are needed.

SUMMARY OF THE INVENTION

In accordance with one aspect of the present invention, a semiconductor structure includes a first silicon-containing layer comprising an element selected from the group consisting essentially of carbon and germanium wherein the silicon-containing layer has a first atomic percentage of the element to the element and silicon, a second silicon-containing layer comprising the element over the first silicon-containing layer, and a silicide layer on the second silicon-containing layer. The element in the second silicon-containing layer has a second atomic percentage of the element to the element and silicon, wherein the second atomic percentage is substantially lower than the first atomic percentage.

In accordance with another aspect of the present invention, a semiconductor structure includes a first silicon-containing compound layer having a first atomic percentage of an element, a second silicon-containing compound layer having a second atomic percentage of the element over the first silicon-containing compound layer wherein the second atomic percentage is substantially lower than the first atomic percentage, and a silicide layer on the second silicon-containing compound layer.

In accordance with another aspect of the present invention, a semiconductor structure includes a semiconductor substrate, a gate stack on the semiconductor substrate, and a SiGe stressor having at least a portion in the semiconductor substrate and adjacent the gate stack, wherein the SiGe stressor includes a first SiGe region wherein germanium in the first SiGe region has a first atomic percentage of germanium to germanium and silicon, and a second SiGe region on the first SiGe region, wherein germanium in the second SiGe region has a second atomic percentage of germanium to germanium and silicon substantially smaller than the first atomic percentage. The semiconductor structure further includes a silicide region on the second SiGe region, wherein germanium in the silicide region has a third atomic percentage of germanium to germanium and silicon, and wherein the third atomic percentage is substantially equal to the second atomic percentage.

In accordance with yet another aspect of the present invention, a method of forming a semiconductor structure includes forming a first SiGe layer, wherein germanium in the first SiGe layer has a first atomic percentage of germanium to germanium and silicon, forming a second SiGe layer over the first SiGe layer, wherein germanium in the second SiGe layer has a second atomic percentage of germanium to germanium and silicon, and wherein the second atomic percentage is substantially smaller than the first atomic percentage, and reacting the second SiGe layer with a metal to form a silicide region.

In accordance with yet another aspect of the present invention, a method of forming a semiconductor structure includes providing a semiconductor substrate, forming a gate stack on the semiconductor substrate, and forming a SiGe stressor having at least a portion in the semiconductor substrate and adjacent the gate stack. The step of forming the SiGe stressor includes forming a first SiGe region, wherein germanium in the first SiGe region has a first atomic percentage of germanium to germanium and silicon, and forming a second SiGe region over the first SiGe region, wherein germanium in the second SiGe region has a second atomic percentage of germanium to germanium and silicon, and wherein the second atomic percentage is substantially less than the first atomic percentage. The second SiGe region is then silicided.

By forming silicide regions on a SiGe layer with a lower germanium atomic percentage, the quality of the resulting silicide region is improved.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel method for improving a silicidation process is provided. The intermediate stages of manufacturing a preferred embodiment of the present invention are illustrated in FIGS. 1 through 7. Variations of the preferred embodiments are then discussed. Throughout the various views and illustrative embodiments of the present invention, like reference numbers are used to designate like elements.

Figure 1:
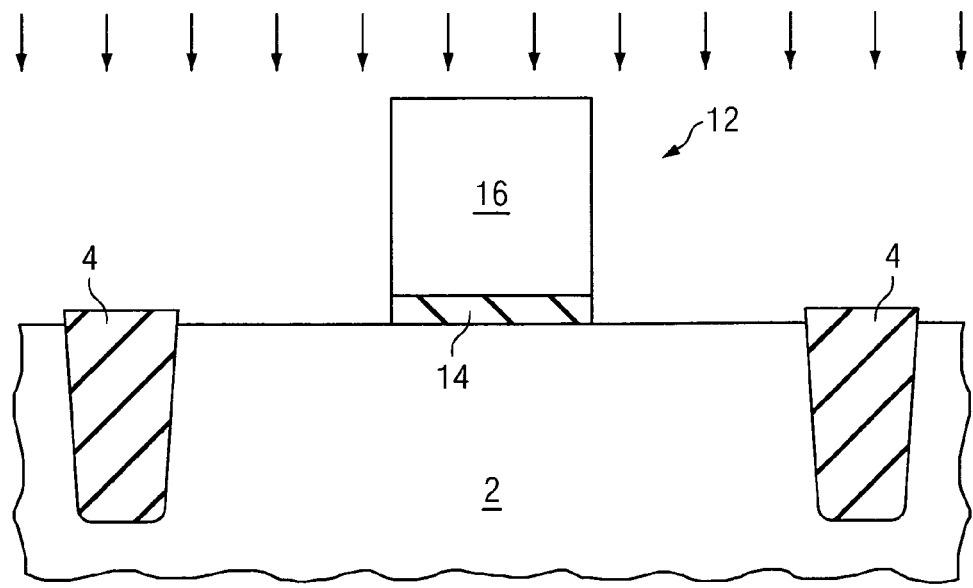
FIGS. 1 through 7 are cross-sectional views of intermediate stages in the manufacture of a preferred embodiment, wherein silicide regions are formed on SiGe stressors of a PMOS device.

FIG. 1 illustrates a substrate 2. Preferably, substrate 2 comprises bulk silicon. Alternatively, substrate 2 comprises bulk SiGe or other semiconductor materials. Substrate 2 may also have a composite structure such as silicon on insulator (SOI). Shallow trench isolation (STI) regions 4 are formed in substrate 2 to isolate device regions. As is known in the art, STI regions 4 may be formed by etching recesses in substrate 2, and then filling the recesses with dielectric materials.

A gate stack 12, comprising a gate dielectric 14 and a gate electrode 16, is formed on substrate 2. Gate dielectric 14 includes commonly used dielectric materials such as oxides, nitrides, oxynitrides, and combinations thereof. Gate electrode 16 may include doped polysilicon, metals, metal silicides, metal nitrides, and combinations thereof. As is known in the art, gate dielectric 14 and gate electrode 16 are preferably formed by depositing a gate electrode layer on a gate dielectric layer, and then patterning the gate electrode layer and the gate dielectric layer.

An optional pre-amorphized implantation (PAI), as symbolized by arrows, is performed to reduce the dopant channeling effect and enhance dopant activation. In the preferred embodiment, silicon, germanium and/or carbon are implanted. In other embodiments, inert gases, such as neon, argon, krypton, xenon, and radon, are used. The pre-amorphized implantation prevents subsequently doped impurities from channeling through spaces between the crystal lattice structure and reaching depths greater than desired. At least a top portion of the (polysilicon) gate electrode 16 and exposed portions of the (single crystalline) substrate 2 are changed to an amorphous state as a result of the PAI.

Figure 2:
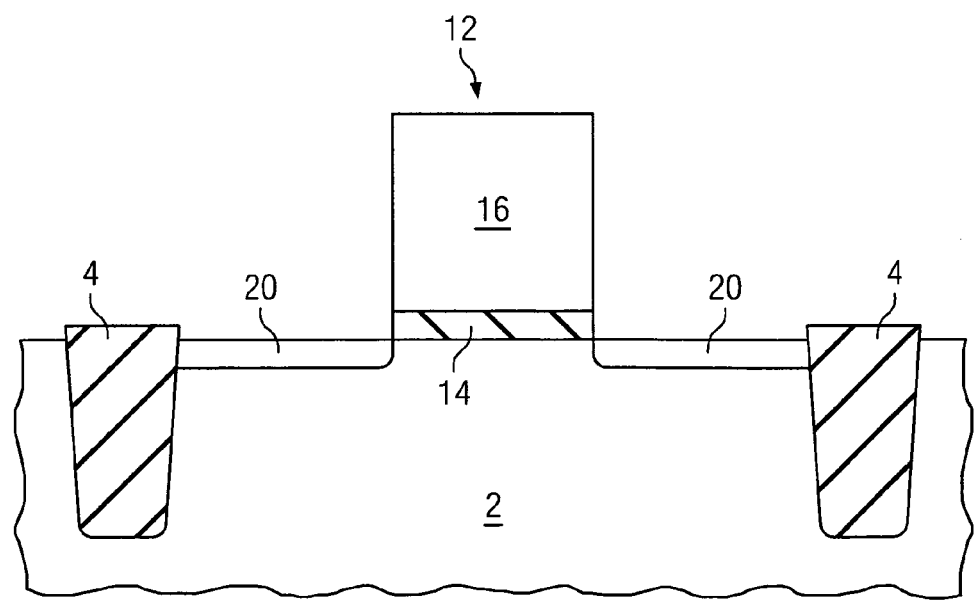

Lightly doped source/drain (LDD) regions 20 are then formed, preferably by implanting a p-type impurity, as is shown in FIG. 2. The gate stack 12 acts as a mask so that LDD regions 20 are substantially aligned with the edges of the respective gate stack 12. Halo/pocket regions (not shown) are also formed, preferably by implanting n-type impurities.

Figure 3:
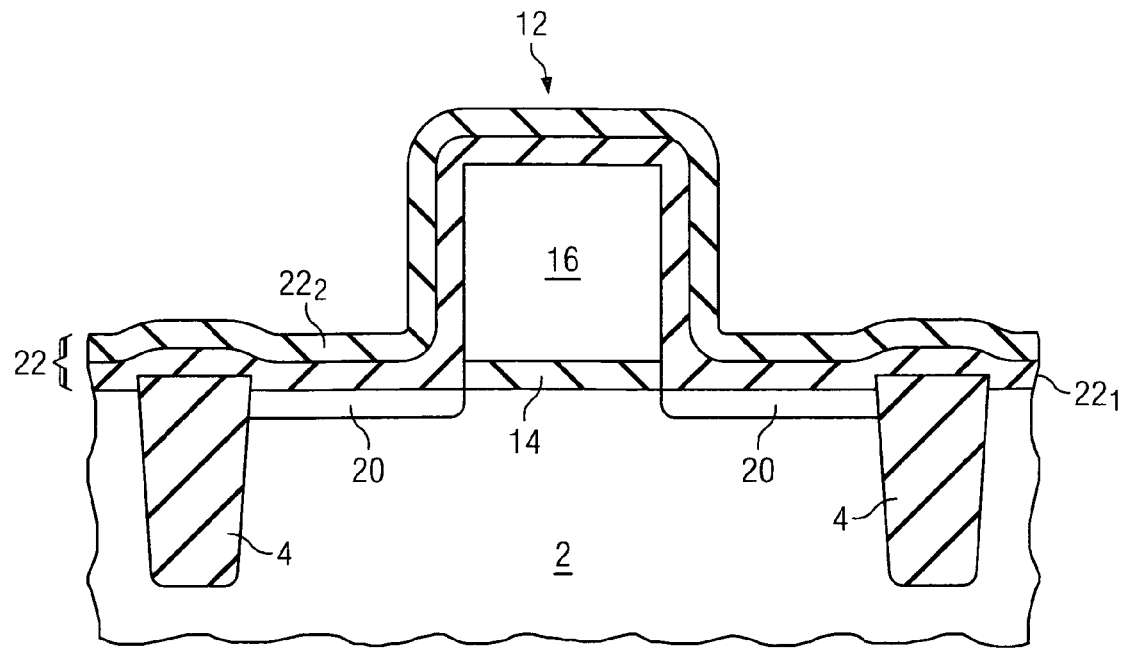

Referring to FIG. 3, a gate spacer layer 22 is formed. In the preferred embodiment, gate spacer layer 22 includes a liner oxide layer $22_1$ and an overlying nitride layer $22_2$. In alternative embodiments, gate spacer layer 22 includes one or more layers, each comprising oxide, silicon nitride, silicon oxynitride (SiON) and/or other dielectric materials, and may be formed using commonly used techniques, such as plasma enhanced chemical vapor deposition (PECVD), low-pressure chemical vapor deposition (LPCVD), sub-atmospheric chemical vapor deposition (SACVD), and the like.

Figure 4:
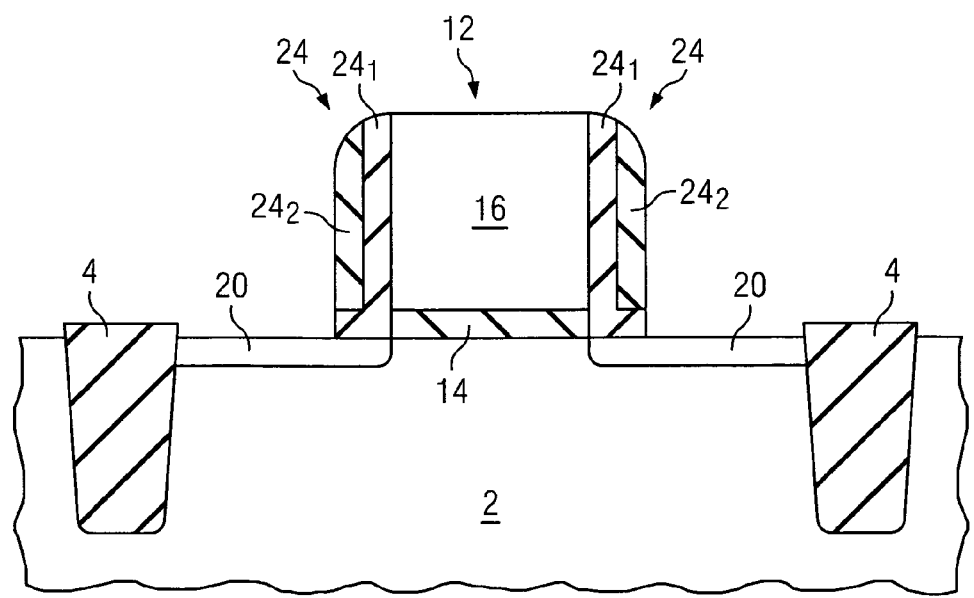

FIG. 4 illustrates the patterning of gate spacer layer 22 to form gate spacers 24, wherein the patterning may be performed by either wet etching or dry etching. The remaining portions of the liner oxide layer $22_1$ and the nitride layer $22_2$ thus form liner oxide portions $24_1$ and nitride portions $24_2$, respectively.

Figure 5:
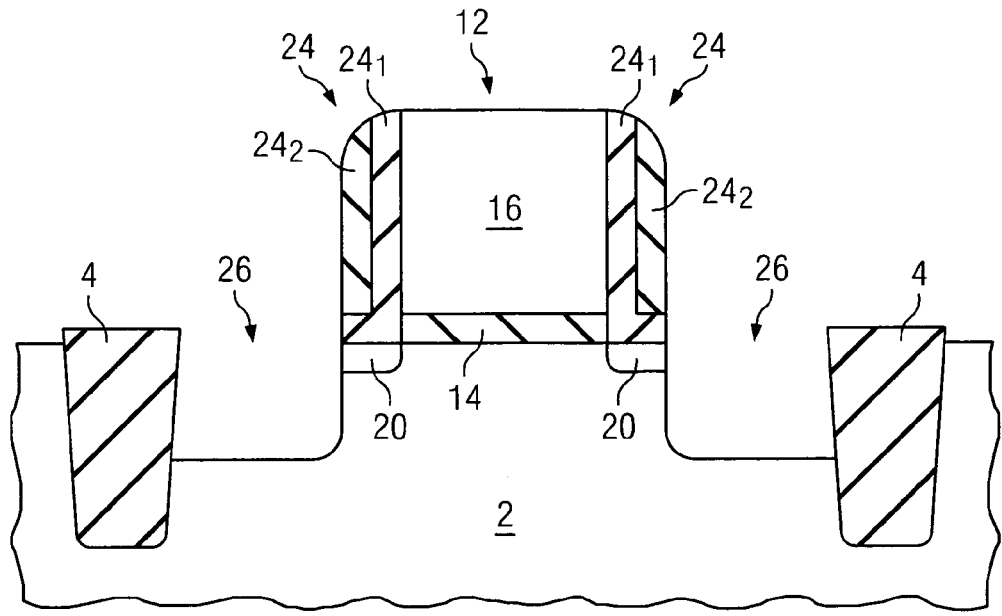

Referring to FIG. 5, recesses 26 are formed along the edges of gate spacers 24, preferably by etching isotropically or anisotropically. The depth of recesses 26 is preferably greater than the depth of the channel region of the resulting MOS device. In 90 nm technology, the preferred depth of the recesses 26 is between about 500 Å and about 1000 Å, and more preferably between about 700 Å and 900 Å.

Figure 6A:
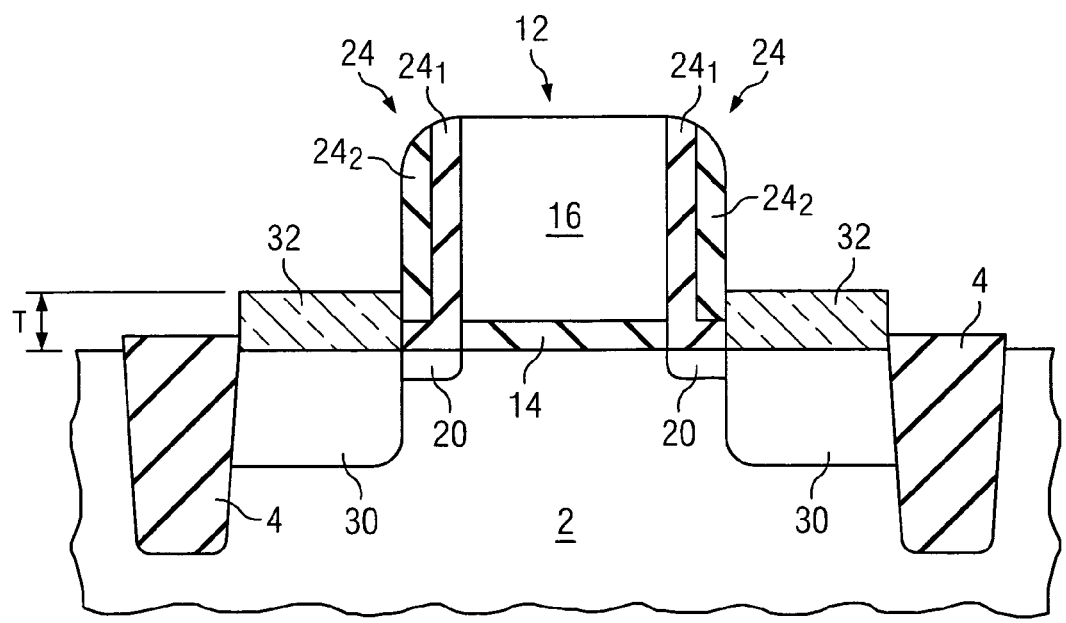

FIG. 6A illustrates the formation of epitaxy regions, often referred to as SiGe stressors or SiGe regions. SiGe regions 30 are first epitaxially grown in recesses 26 by selective epitaxial growth (SEG). SiGe regions 30 preferably have a lattice spacing greater than the lattice spacing of silicon substrate 2. In an exemplary embodiment, the SiGe regions 30 are performed using remote plasma-enhanced chemical vapor deposition (RPCVD) in a chamber, in which the pressure is preferably between about 1 torr and about 20 torr, and more preferably between about 5 and about 15 torr. The preferred temperature is between about 500° C. and about 1000° C., and more preferably between about 600° C. and about 800° C. The precursors include Si-containing gases and Ge-containing gases, such as $SiH_4$ and $GeH_4$, respectively, and the partial pressures of the Si-containing gases and Ge-containing gases are adjusted to modify the atomic ratio of germanium to silicon. In the preferred embodiment, the resulting SiGe regions 30 include between about 20 atomic percent and about 40 atomic percent germanium. In the preferred embodiment, SiGe regions 30 have a top surface substantially close to the top surface of substrate 2. In other embodiments, the top surface of SiGe regions 30 is higher than the top surface of substrate 2. An advantageous feature of these embodiments is that with SiGe having a high Ge concentration at a same level as the channel region, the stress applied to the channel region is less adversely affected by the subsequent formation of a SiGe layer having a low germanium concentration.

Process conditions for the epitaxial process are then changed to form SiGe regions 32 on SiGe regions 30, wherein less germanium is introduced. Preferably, the formation of SiGe regions 32 is performed in-situ with the formation of SiGe regions 30. In an exemplary embodiment, the partial pressure of the Ge-containing gases such as $GeH_4$ is reduced to lessen the germanium concentration in SiGe regions 32. The resulting SiGe regions 32 have a preferred Ge concentration of between about 15 atomic percent and about 20 atomic percent. A ratio of the atomic percentage of germanium in SiGe regions 32 to the atomic percentage of germanium in SiGe regions 30 is preferably between about 50 percent to about 70 percent. The thickness T of the SiGe regions 32 is at least equal to, and more preferably greater than, the amount that will be consumed in the subsequent silicidation process. The combined thickness of SiGe regions 30 and 32 is preferably between about 500 Å and 900 Å.

In other embodiments, other methods such as diffusion can be used to deposit SiGe regions 30 and 32. After being annealed, the SiGe will try to restore its lattice spacing, thus introducing a compressive stress to the channel region.

Figure 6B:
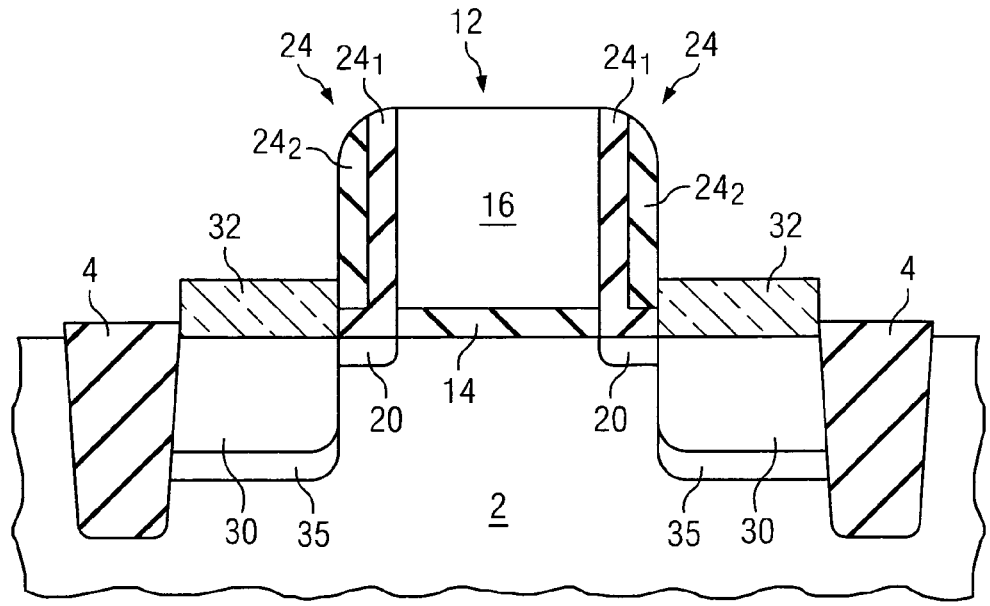

The previously illustrated process can be further modified to form additional SiGe regions, which have a Ge atomic percentage that is different from SiGe regions 30 and 32. FIG. 6B illustrates an embodiment wherein the additional SiGe regions 35 are formed under SiGe regions 30. The Ge atomic percentage in SiGe regions 35 may be higher or lower than either of the SiGe regions 30 and 32. Alternatively, the additional SiGe regions 35 may be formed between SiGe regions 30 and 32, and the Ge atomic percentage in SiGe regions 35 may be higher or lower than either of the SiGe regions 30 and 32. The additional SiGe regions 35 may even be a semiconductor layer substantially free from silicon.

Figure 7:
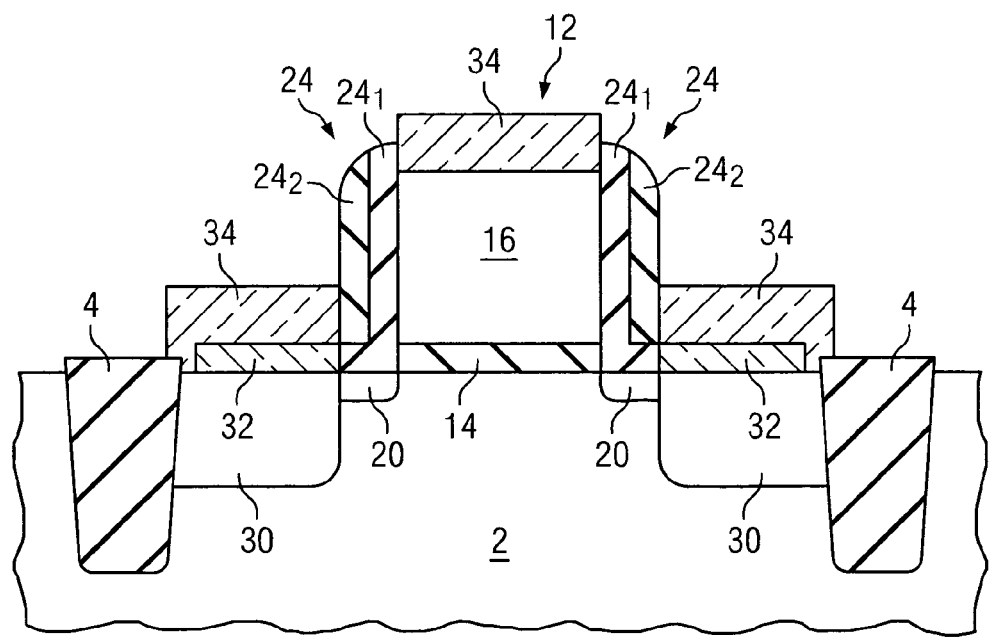

FIG. 7 illustrates the formation of germano-silicide regions 34, which preferably have a thickness of between about 50 Å and about 300 Å. Throughout the description, germano-silicide regions 34 are also referred to as silicide regions 34. As is known in the art, germano-silicide regions 34 are preferably formed by blanket depositing a thin layer of metal, such as nickel, platinum, palladium, vanadium, titanium, cobalt, tantalum, ytterbium, zirconium, and combinations thereof. The substrate is then heated, which causes the silicon and germanium to react with the metal where contacted. After the reaction, a layer of metal silicide and/or metal germano-silicide is formed between silicon/germanium and metal. The un-reacted metal is selectively removed through the use of an etchant that attacks metal but does not attack silicide and germano-silicide. In the preferred embodiment, the portion of SiGe consumed in the silicidation process is shallower, or at most equal to, the thickness of SiGe regions 32, and none of SiGe regions 30 is consumed. The remaining SiGe regions 32 preferably have a thickness of less than about 300 Å, and more preferably between about 50 Å and about 300 Å. The remaining thickness can also be close to 0 Å.

By limiting the silicidation process in SiGe regions having a moderate Ge atomic percentage, for example, between about 10 percent and about 15 percent, the resulting germano-silicide regions 34 have a smoother interface with the underlying SiGe layer. In addition, metals tend to form silicides more easily with silicon than with germanium, thus the silicidation process is expedited, and the thermal budget is reduced.

The previously discussed embodiment illustrates SiGe stressors that are formed aligned with the edges of spacers. Alternatively, SiGe stressors can be formed misaligned with the edges of spacers through the formation of dummy spacers. In an exemplary embodiment, the formation process includes forming a gate stack, forming dummy gate spacers, recessing the substrate, growing composite SiGe stressors comprising a high-germanium layer on a low-germanium layer, removing the dummy gate spacers, forming LDD regions and halo/pocket regions, forming main gate spacers, doping source/drain regions, and forming silicide regions on the source/drain regions and the gate electrode.

Figure 8:
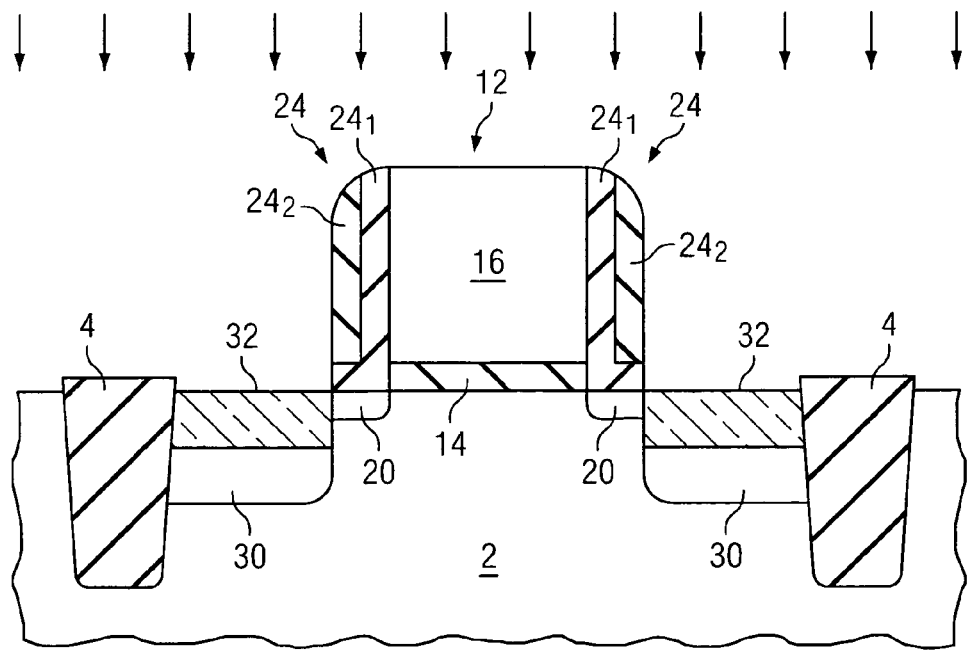
FIG. 8 illustrates another embodiment of the present invention, wherein SiGe stressors of a PMOS device are formed by implanting.

FIG. 8 illustrates an alternative embodiment for forming SiGe regions. The initial steps of this embodiment are essentially the same as illustrated in FIGS. 1 through 4. Germanium is then implanted to the future source/drain regions. More than one implantation, each having a different energy, may be needed to form desired Ge concentration profiles as discussed in the preceding paragraphs. Carbon may also be implanted.

Although the embodiments discussed in the preceding paragraphs uses SiGe regions formed in PMOS devices as examples, one skilled in the art will realized that the concept of the present invention is readily available for the formation of NMOS devices. The NMOS devices may have a similar structure as illustrated in FIG. 7, except that regions 30 and 32 comprise SiC instead of SiGe. Preferably, regions 32 comprise less carbon than regions 30. Preferably, the atomic percentage of carbon to carbon and silicon in regions 30 and 32 are similar to the atomic percentage of germanium to germanium and silicon as discussed in preceding paragraphs.

Figure 9:
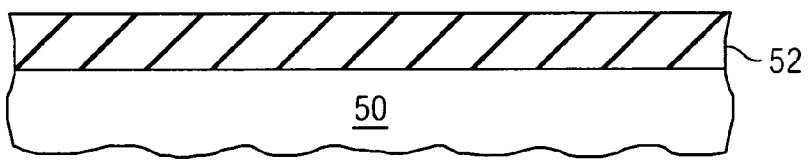
FIGS. 9 through 11 illustrate an oxide layer underlying a SiGe layer and a silicide region formed on the SiGe layer.
Figure 10:
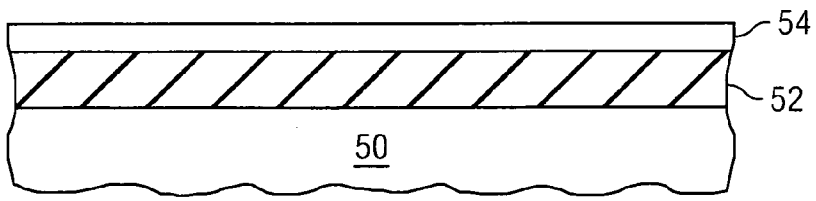
Figure 11:
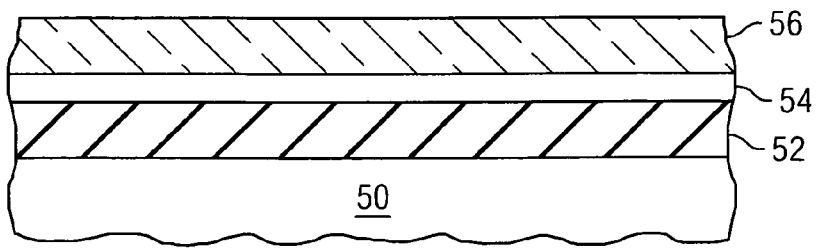

FIGS. 9 through 11 illustrate a further embodiment for forming improved silicide regions on SiGe layer(s). Referring to FIG. 9, a first SiGe layer 50 is formed, which has a relatively high Ge atomic percentage, for example, between about 20 percent and about 40 percent. An oxide layer 52 is then formed on first SiGe layer 50. Oxide layer 52 preferably includes silicon oxide, and can be formed using CVD, local oxidation of silicon (LOCOS), or other commonly used methods.

A second SiGe layer 54 is then formed over oxide layer 52, as illustrated in FIG. 10. Second SiGe layer 54 preferably has a Ge atomic percentage similar to the first SiGe layer 50. Second SiGe layer 54 is preferably thin, for example, with a thickness of between about 50 Å and about 200 Å. However, the thickness is preferably slightly greater than that which will be consumed in the subsequent silicidation process.

In a subsequent annealing process, the germanium in second SiGe layer 54 diffuse into oxide layer 52 and reacts with the oxide therein, and thus the Ge concentration in second SiGe layer 54 is reduced. Preferably, the annealing process and/or the thicknesses of the layers 52 and 54 are controlled, so that the resulting SiGe layer 54 has a Ge atomic percentage of between about 10 percent and about 15 percent.

FIG. 11 illustrates the formation of a silicide region 56, which preferably has a thickness of between about 50 Å and about 300 Å. The formation process of the silicide region 56 is similar to what has been discussed in the preceding paragraphs, thus is not repeated herein. Again, since the Ge atomic percentage in second SiGe layer 54 is controlled, for example, in a controlled range of between about 10 percent and about 15 percent, the interface between silicide region 56 and second SiGe layer 54 is smoother.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor structure comprising:
   a first silicon-containing layer comprising an element selected from the group consisting essentially of carbon and germanium, wherein the first silicon-containing layer has a first atomic percentage of the element to the element and silicon;
   a second silicon-containing layer comprising the element over the first silicon-containing layer, wherein the element in the second silicon-containing layer has a second atomic percentage of the element to the element and silicon, and wherein the second atomic percentage is substantially lower than the first atomic percentage; and
   a silicide layer over and contacting the second silicon-containing layer.

2. The semiconductor structure of claim 1, wherein the element in the silicide layer has a third atomic percentage substantially equal to the second atomic percentage.

3. The semiconductor structure of claim 1 further comprising a MOS device, wherein the first and the second silicon-containing layers form a stressor of the MOS device.

4. The semiconductor structure of claim 1, wherein the second atomic percentage is between about 10 percent and about 15 percent.

5. The semiconductor structure of claim 1, wherein the second atomic percentage is between about 50 percent and about 70 percent of the first atomic percentage.

6. The semiconductor structure of claim 1, wherein the first atomic percentage is between about 20 percent and about 40 percent.

7. The semiconductor structure of claim 1 further comprising a third silicon-containing layer underlying the first silicon-containing layer, wherein the element in the third silicon-containing layer has a third atomic percentage different from the first atomic percentage.

8. The semiconductor structure of claim 1 further comprising an oxide layer between the first and the second silicon-containing layers.

9. The semiconductor structure of claim 1, wherein the second silicon-containing layer has a thickness of less than about 300 Å.

10. The semiconductor structure of claim 9, wherein the thickness of the second silicon-containing layer is close to 0 Å.

11. The semiconductor structure of claim 1, wherein the element is carbon.

12. A semiconductor structure comprising:
a semiconductor substrate;
a gate stack on the semiconductor substrate;
a SiGe stressor having at least a portion in the semiconductor substrate and adjacent the gate stack, wherein the SiGe stressor comprises:
a first SiGe region, wherein germanium in the first SiGe region has a first atomic percentage of germanium to germanium and silicon; and
a second SiGe region on the first SiGe region, wherein germanium in the second SiGe region has a second atomic percentage of germanium to germanium and silicon, and wherein the second atomic percentage is substantially lower than the first atomic percentage; and
a silicide region on the second SiGe region, wherein germanium in the silicide region has a third atomic percentage of germanium to germanium and silicon, and wherein the third atomic percentage is substantially equal to the second atomic percentage.

13. The semiconductor structure of claim 12, wherein a bottom surface of the second SiGe region is substantially level with or higher than a top surface of the semiconductor substrate.

14. The semiconductor structure of claim 12, wherein the second atomic percentage is between about 10 percent and about 15 percent, and wherein the first atomic percentage is between about 20 percent and about 40 percent.

15. The semiconductor structure of claim 12, wherein the second atomic percentage is between about 50 percent and about 70 percent of the first atomic percentage.

16. The semiconductor structure of claim 12 further comprising a third SiGe region underlying the first SiGe region, wherein germanium in the third SiGe region has a fourth atomic percentage different from the first atomic percentage.

17. A semiconductor structure comprising:
a semiconductor substrate;
a first and a second recess in the semiconductor substrate and spaced apart from each other;
a first and a second stressor in the first and the second recesses, respectively, wherein each of the first and the second stressors comprises:
a first silicon-containing compound layer having a first atomic percentage of an element selected from the group consisting essentially of germanium and carbon;
a second silicon-containing compound layer having a second atomic percentage of the element over and contacting the first silicon-containing compound layer, wherein the second atomic percentage is lower than the first atomic percentage; and
a silicide layer over and contacting the second silicon-containing compound layer; and
a semiconductor region in the semiconductor substrate and horizontally between and adjoining the first and the second stressors, wherein the semiconductor region is substantially free from the element.

18. The semiconductor structure of claim 17 further comprising:
a gate dielectric over the semiconductor region; and
a gate electrode over the gate dielectric.

19. The semiconductor structure of claim 17, wherein the element in the silicide layer has a third atomic percentage substantially equal to the second atomic percentage.

20. The semiconductor structure of claim 17, wherein the second atomic percentage is between about 50 percent and about 70 percent of the first atomic percentage.

* * * * *